(12) United States Patent
Matsuoka et al.

(10) Patent No.: US 7,547,614 B2
(45) Date of Patent: Jun. 16, 2009

(54) SOLUTION TREATMENT APPARATUS AND SOLUTION TREATMENT METHOD

(75) Inventors: Nobuaki Matsuoka, Kumamoto (JP); Tsunenaga Nakashima, Kumamoto (JP); Shinichi Hayashi, Kumamoto (JP); Akira Oozono, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 528 days.

(21) Appl. No.: 11/139,465

(22) Filed: May 31, 2005

(65) Prior Publication Data

US 2006/0189103 A1 Aug. 24, 2006

(30) Foreign Application Priority Data

Feb. 18, 2005 (JP) ............... 2005-042698

(51) Int. Cl.
*H01L 21/20* (2006.01)
(52) U.S. Cl. .................... 438/478; 427/240
(58) Field of Classification Search ............... 210/748; 427/240; 438/478
See application file for complete search history.

(56) References Cited

U.S. PATENT DOCUMENTS 5,876,280 A * 3/1999 Kitano et al. ............... 454/187
6,159,541 A * 12/2000 Sakai et al. ................. 427/240
6,715,943 B2 4/2004 Nagamine
6,752,872 B2 6/2004 Inada et al.

FOREIGN PATENT DOCUMENTS

JP 2000-156341 6/2000

* cited by examiner

*Primary Examiner*—Walter D Griffin
*Assistant Examiner*—Cameron J Allen
(74) *Attorney, Agent, or Firm*—Smith, Gambrell & Russell, LLP

(57) ABSTRACT

In the present invention, a plurality of exhaust paths connected to a plurality of cup bodies surrounding substrate holding portions respectively are joined together for common use, and the openings of exhaust rate adjustment sections provided on the exhaust paths are adjusted with reference to data in which combinations of the numbers of rotations of the substrate holding portions are associated with combinations of set exhaust rates of the exhaust paths when solution treatment is performed by rotating the substrate by the substrate holding portion. According to the present invention, the cup body can be exhausted at an intended exhaust rate at all times independently of the state where the substrate in which cup body is subjected to which process.

15 Claims, 11 Drawing Sheets

SOLUTION TREATMENT APPARATUS AND SOLUTION TREATMENT METHOD

BACKGROUND OF THE INVENTION

1. Field of the Invention

The present invention relates to a solution treatment apparatus for performing solution treatment, for example, application of a resist, developing treatment after exposure, or the like, for a substrate such as, for example, a semiconductor wafer or a glass substrate for a liquid crystal display (LCD substrate), and a method therefor.

2. Description of the Related Art

The process of forming a resist pattern on a substrate that is one of manufacturing processes of a semiconductor device or an LCD substrate is performed by a series of processes of forming a resist film on the substrate, for example, a semiconductor wafer (hereinafter, referred to as a wafer), exposing the resist film to light using a photomask, and thereafter performing developing treatment so as to obtain a desired pattern. The series of processes have conventionally been performed by a coating and developing apparatus.

The coating and developing apparatus includes solution treatment units such as a coating unit for applying a resist solution, an anti-reflection film forming unit for applying a treatment solution for an anti-reflection film, and, to ensure a high throughput, a plurality of coating units and anti-reflection units are generally provided.

In the solution treatment unit, a cup body is provided in a manner to surround a spin chuck being a wafer holding portion, and treatments such as spin coating, shake-off drying, and side rinse are mainly performed in the unit. During the spin coating, the treatment solution dropped on the central portion of the wafer is spread in the radial direction of the wafer by centrifugal force, and therefore exhaust is performed by an exhaust pipe connected to the cup body to exhaust mist scattered by the spin. In this case, if the exhaust of mist is too strong, which may affect the thickness of the film on the wafer, and therefore the strength of the exhaust is determined depending on both of them.

During the shake-off drying and the side rinse, a solvent of the treatment solution is discharged while the wafer is being rotated or the treatment solution on the substrate is shaken off by rotation at a high speed, leading to an accordingly large amount of mist scattered, and therefore exhaust stronger than that during the spin coating may be required.

In this regard, Japanese Patent Application Laid-open No. 2000-156341 describes that exhaust pipes connected to cup bodies are joined together for common use at their midpoints, and opening/closing valves whose opening and closing are controlled by turning on or off are provided along the respective exhaust pipes upstream from the common point.

SUMMARY OF THE INVENTION

The present inventors study separating a block including the coating unit of the resist solution being a solution treatment unit for forming a resist film and a forming unit of an anti-reflection film from a block in which developing treatment is performed, and independently forming a carrier path on a straight line on which the wafer is carried from a carrier block (a region where a cassette housing a plurality of wafers is placed) to an aligner and a carrier path on a straight line returning from the aligner to the carrier block, thereby further increasing the throughput.

Further, the inventors also study arranging a plurality of cup bodies, which form a part of the solution treatment unit, along the carrier path and connecting exhaust pipes, which are connected to the bottom of the cup bodies respectively, to a common exhaust pipe disposed along the arrangement of the cup bodies. Since the exhaust pipes have a large diameter, a large space is required when the exhaust pipes of the cup bodies are separately extended to the outside of the apparatus. For this reason, the above-described configuration studied by the present inventors is advantageous also in that the routing space of the exhaust pipes can be reduced.

In this regard, during rotation of the spin chuck in one cup body with strong exhaust being performed, and when the spin chuck also rotates in another cup body to perform treatment for a wafer and strong exhaust is intended, the following problems will occur according to the prior art.

That is, with low exhaust ability, the exhaust flow rate in each cup body may be different between the case where one cup body is exhausted and the case where two cup bodies are exhausted concurrently. Accordingly, in order to attain a predetermined exhaust rate in each cup body at all times, the exhaust ability needs to be increased.

In the configuration in which the exhaust pipes connected to the bottom of the cup bodies respectively are connected to the common exhaust pipe disposed along the arrangement of the cup bodies as described above, which is studied by the present inventors, there is a difference in distance from the joint point of the exhaust pipes for all of the cup bodies to the discharge port of each cup body. Accordingly, assuming that, for example, the cup body closest to the joint point is a first unit, the farthest cup body is a third unit, and a cup body located therebetween is a second unit, the distance from the first unit to the joint point is shorter than that of the third unit, and the first unit is located closer to an exhaust source and the third unit is located farther to the exhaust source as seen from the second unit.

Accordingly, comparing the timing when the strong exhaust in the first unit and the strong exhaust in the second unit overlap and the timing when the strong exhaust in the first unit and the strong exhaust in the third unit overlap, the loss in pressure is larger at the former timing than at the latter timing as seen from the second unit, so that an intended exhaust rate cannot be attained in the second unit at the former timing.

For this reason, the exhaust rate in a certain cup body differs depending on the other cup body when the exhausts overlap, even with its opening/closing valve being opened at the same degree. Moreover, the speed at which the substrate is rotated differs depending on the kind of process in the cup body, that is, the spin coating of the coating solution or the shake-off drying, and therefore the exhaust rate in the cup body will vary also depending on the kind of process in the other cup body with which the exhausts overlap.

As a result, the use of the prior art may fail to attain the exhaust rate intended in accordance with the processes. This causes mist adhering to the wafer or unstable film thickness of the resist on the surface of the wafer.

The present invention has been developed in view of the above-described point, and its object is to reduce the space of the exhaust pipes and to perform exhaust in the cup body in each solution treatment section in an intended exhaust state at all times in a solution treatment apparatus including a plurality of solution treatment sections each including rotation of the substrate and exhaust.

To attain the above-described object, the present invention is a solution treatment apparatus in which a substrate holding portion is rotated with a treatment solution being supplied from a treatment solution nozzle onto a substrate held on the substrate holding portion to spread the treatment solution on the substrate, the apparatus including: a plurality of substrate holding portions; a plurality of cup bodies provided to surround substrates held on the substrate holding portions respectively; a plurality of exhaust paths connected to the plurality of cup bodies respectively; a common exhaust path connected in common to the plurality of exhaust paths; a plurality of exhaust rate adjustment sections provided on the plurality of exhaust paths respectively; a storage section for storing data in which combinations of the numbers of rotations of the plurality of substrate holding portions are associated with combinations of set exhaust rates of the exhaust paths; and a control section for determining the numbers of rotations of the substrate holding portions, reading a combination of the set exhaust rates corresponding to a combination of the determined numbers of rotations of the substrate holding portions referring to the data in the storage section, and adjusting openings of the exhaust rate adjustment sections to obtain openings corresponding to the read set exhaust rates.

The method for determining the number of rotations of each substrate holding portion may be realized, for example, by detecting the number of rotations of each substrate holding portion. The method may be realized, for example, by writing, into a memory, what kind of treatment is currently being performed in each cup body, reading the state in each cup body from the memory, and reading the number of rotations of the substrate holding portion corresponding to the state (treatment) from another table.

According to the present invention, a plurality of exhaust paths connected to a plurality of cup bodies surrounding substrate holding portions respectively are joined together for common use, and the openings of exhaust rate adjustment sections provided on the exhaust paths are adjusted with reference to data in which combinations of the numbers of rotations of the substrate holding portions are associated with combinations of set exhaust rates of the exhaust paths when solution treatment is performed by rotating the substrate by the substrate holding portion. Therefore, the cup body can be exhausted at an intended appropriate exhaust rate, not too high nor too low, at all times independently of the state where the substrate in which cup body is subjected to which process. This can suppress adhesion of mist to the substrate and stabilize the film thickness of a thin film such as a resist on the substrate. In addition, the exhaust pipes connected to the cup bodies are joined together for common use in a casing in which the cup bodies are commonly housed, whereby the space required for routing the exhaust pipes can be decreased, resulting in contribution to reduced space of the solution treatment apparatus. Further, the cup bodies are exhausted at predetermined exhaust rates as described above, thereby eliminating excessive exhaust, so that the exhaust volume of the whole apparatus can be reduced to reduce the exhaust volume of a plant facility.

Further, according to another aspect of the present invention, the present invention is a solution treatment apparatus in which a substrate holding portion is rotated with a treatment solution being supplied from a treatment solution nozzle onto a substrate held on the substrate holding portion to spread the treatment solution on the substrate, the apparatus including: a plurality of substrate holding portions; a plurality of cup bodies provided to surround substrates held on the substrate holding portions respectively; a plurality of exhaust paths connected to the plurality of cup bodies respectively; a common exhaust path connected in common to the plurality of exhaust paths; a plurality of exhaust rate adjustment sections provided on the plurality of exhaust paths respectively; and a plurality of exhaust rate amplification mechanisms provided on the plurality of exhaust paths respectively, wherein each of the exhaust rate adjustment sections is set to have an opening corresponding to the number of rotations of the substrate holding portion in the cup body connected to the exhaust path on which the exhaust rate adjustment section is provided, and wherein each of the exhaust rate amplification mechanisms supplements a shortage of each exhaust rate adjusted by each of the exhaust rate adjustment sections such that the exhaust rate in each of the exhaust paths has a set exhaust rate.

Each of the exhaust rate adjustment sections is set to have an opening corresponding to the number of rotations of the substrate holding portion in the cup body connected to the exhaust path on which the exhaust rate adjustment section is provided, and the exhaust rate amplification mechanism is used to supplement a shortage of the exhaust rate as described above, whereby each cup body can be exhausted at an appropriate exhaust rate even by a low exhaust ability at the base side of the common exhaust path, for example, a low exhaust ability of the plant exhaust path.

DETAILED DESCRIPTION OF THE PREFERRED EMBODIMENT

Figure 1A:
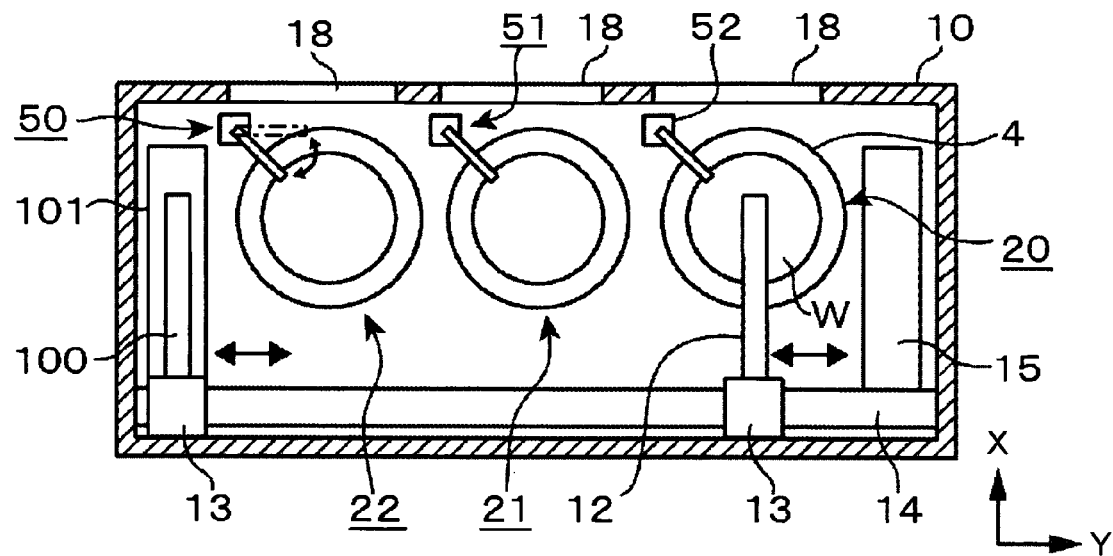
FIGS. 1A and 1B are a plan view and a cross-sectional view showing a solution treatment apparatus according to an embodiment of the present invention.
Figure 1B:
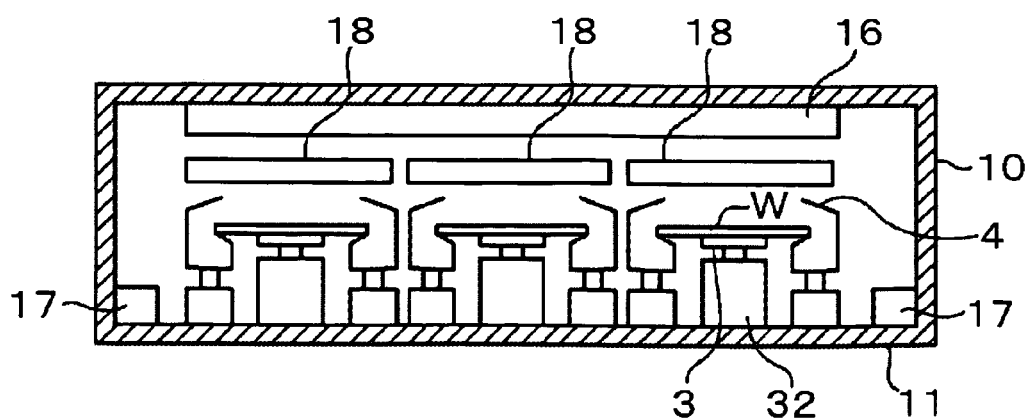

An embodiment in which a solution treatment apparatus according to the present invention is applied to a coating apparatus of a resist solution will be described. In FIGS. 1A and 1B, a numeral 10 denotes a solution treatment apparatus in which three solution treatment sections 20, 21, and 22 are provided in a common casing 11 such that they are arranged in a horizontal direction (Y-axis direction) in this example. These solution treatment sections 20, 21, and 22 have the same configuration and therefore will be described in detail with reference to FIG. 2 taking the solution treatment section 20 as an example.

Figure 2:
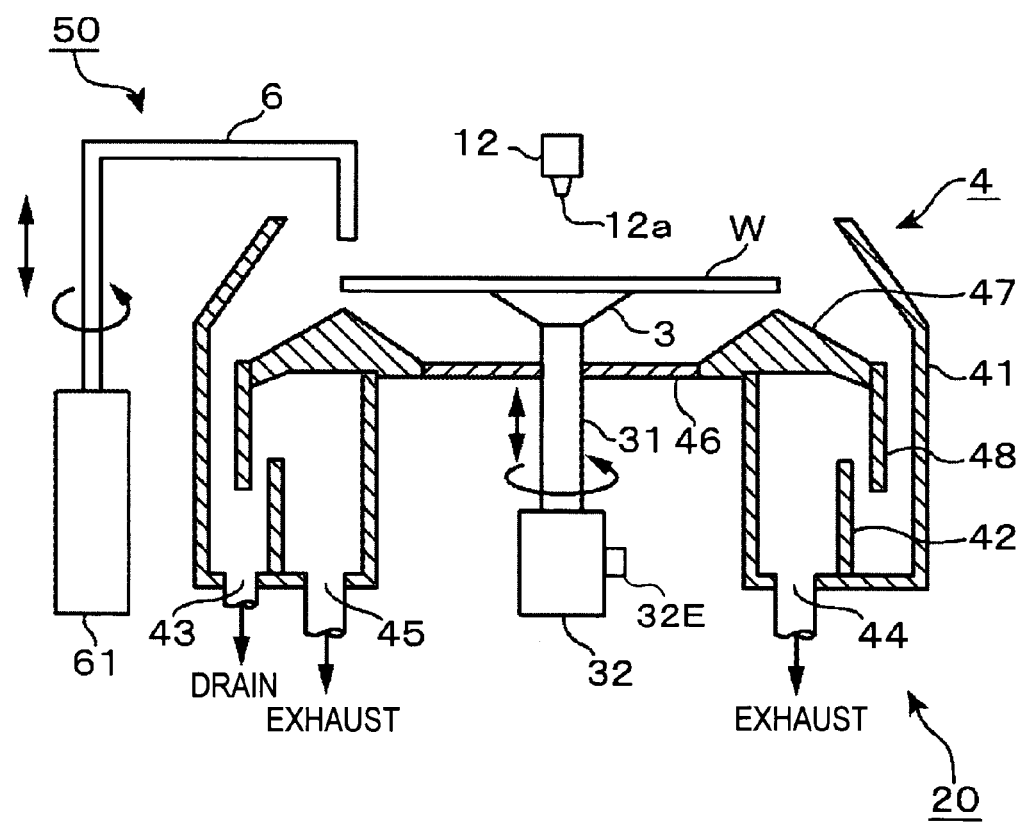
FIG. 2 is a schematic cross-sectional view showing a solution treatment section installed in the solution treatment apparatus according to the embodiment of the present invention.

In FIG. 2, a numeral 3 denotes a spin chuck being a substrate holding portion for horizontally holding a wafer W by absorbing by suction the central portion on the rear face side of the wafer W. The spin chuck 3 is connected via a shaft portion 31 to a drive mechanism (spin chuck motor) 32 and configured to be capable of rotating and rising and lowering while holding the wafer W by means of the drive mechanism 32.

A cup body 4 with its upper side open is provided outside the periphery of the wafer W held on the spin chuck 3 in a manner to surround the wafer W. The upper end side of the side face of the cup body 4 is inclined inward. On the bottom side of the cup body 4, a solution receiving portion 41 in a recessed shape is partitioned into an outer region and an inner region below the entire periphery of the wafer W. A drain port 43 for draining drainage such as a coating solution gathered is provided at the bottom of the outer region, and two exhaust ports 44 and 45 are provided at the bottom of the inner region. A circular plate 46 is provided below the wafer W, and a ring member 47 is provided in a manner to surround the outside of the circular plate 46. An end plate 48 extending downward is further provided at an outer end face of the ring member 47 in a manner to enter the outer region so that the coating solution runs on the surface of the end plate 48 and the ring member 47 to be guided to the outer region. Through not shown, raising and lowering pins capable of rising and lowering while supporting the rear face side of the wafer W are provided in the circular plate 46 passing from its top to bottom so as to allow the wafer W to be delivered to/from the spin chuck 3 through cooperation with the raising and lowering pins and later-described main arms A1 to A5.

Figure 3:
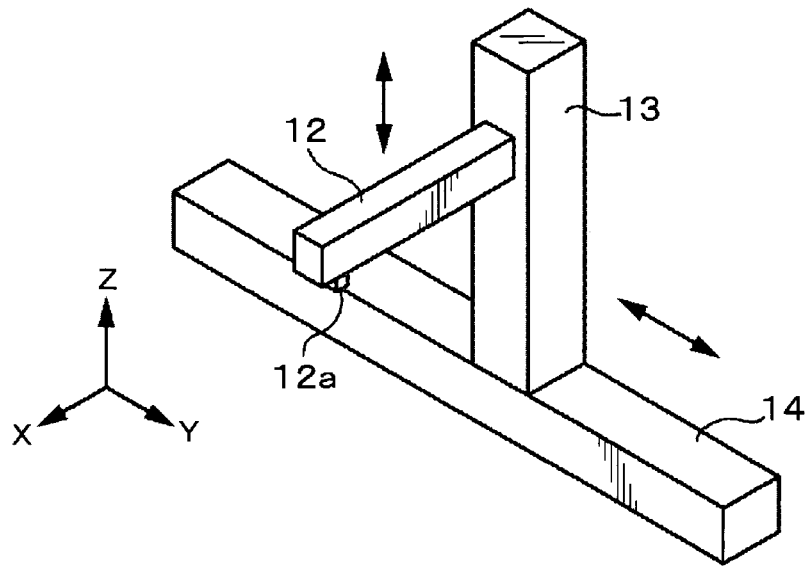
FIG. 3 is a schematic perspective view showing a treatment solution nozzle provided in the solution treatment apparatus according to the embodiment of the present invention.

Returning the description to FIGS. 1A and 1B, a numeral 12 denotes a common nozzle drive portion for supplying a treatment solution to the three solution treatment sections 20, 21, and 22, and the nozzle drive portion 12 is configured to freely rise and lower in a Z-direction by a Z-axis moving mechanism 13 and to freely move in a Y-axis direction by a guide rail 14 provided along a length direction (Y-direction) of the solution treatment apparatus 10, as also shown in FIG. 3. In the drawing, a numeral 15 denotes a waiting region of the nozzle drive portion 12 provided outside the solution treatment section 20 on one end side.

As shown in FIG. 2 and FIG. 3, a treatment solution nozzle 12a with a small discharge port through which the treatment solution is discharged is formed on one end side of the nozzle drive portion 12, such that during a later-described spin coating, the small discharge port formed in the treatment solution nozzle 12a is located opposed to, for example, the central portion of the surface of the wafer W held on each spin chuck 3 by means of the Z-axis moving mechanism 13 and the guide rail 14.

Numeral 100 in the drawing denotes a common nozzle drive portion for supplying a cleaning solution to the three solution treatment sections 20, 21, and 22, and their description will be omitted herein for convenience because the nozzle drive portion 100 has the same configuration as that of the nozzle drive portion 12. Numeral 101 in the drawing denotes a waiting region of the nozzle drive portion 100 provided outside the solution treatment section 22 on one end side. During operation of the nozzle drive portion 12, the nozzle drive portion 100 will wait at the waiting region 101.

In FIGS. 1A and 1B, a numeral 16 denotes a filter unit attached to the ceiling portion of the solution treatment apparatus 10, and a numeral 17 denotes an exhaust section provided at the bottom face of the treatment solution apparatus 10. Exhausting gas through the exhaust section 17 at a predetermined exhaust rate and supplying a clean gas at a predetermined flow rate from the filter unit 16 form downflow of the clean gas in the solution treatment apparatus 10. Numerals 18 in the drawings denote carry-in/out ports for the wafers W formed in a surface facing the moving regions of the later-described main arms A1 to A5 in the solution treatment apparatus 10.

Numerals 50, 51, and 52 denote side rinse mechanisms each for supplying a rinse solution to the periphery of the wafer W held on the spin chuck 3. These side rinse mechanisms 50, 51, and 52 have the same configuration and therefore will be described in detail with reference to FIG. 2 taking the side rinse mechanism 50 as an example. The side rinse mechanism 50 is provided near the solution treatment section 20 and composed of a rinse nozzle 6 folded in an L-shape and a drive portion 61 for driving the rinse nozzle 6 such that the rinse nozzle 6 freely rises and lowers in the vertical direction and freely rotates. As shown in FIGS. 1A and 1B, the rinse nozzle 6 is located at the predetermined waiting position while it is not performing side rinse. In this example, the side rinse nozzle 6 will wait at a position below the carry-in/out port 18. To perform side rinse, the drive portion 61 first raises the rinse nozzle 6 to a position where its tip portion is located above the upper end portion of the side peripheral face of the cup body 4. Subsequently, the drive portion 61 rotates the rinse nozzle 6 about 45 degrees and moves it to a position opposed to the peripheral portion of the wafer W held on the spin chuck 3. The drive portion 61 then lowers the rinse nozzle 6 to allow the rinse nozzle 6 to approach the wafer W. After the side rinse is finished, the rinse nozzle 6 is returned to the predetermined waiting position through a procedure reverse to the above-described procedure.

Figure 4:
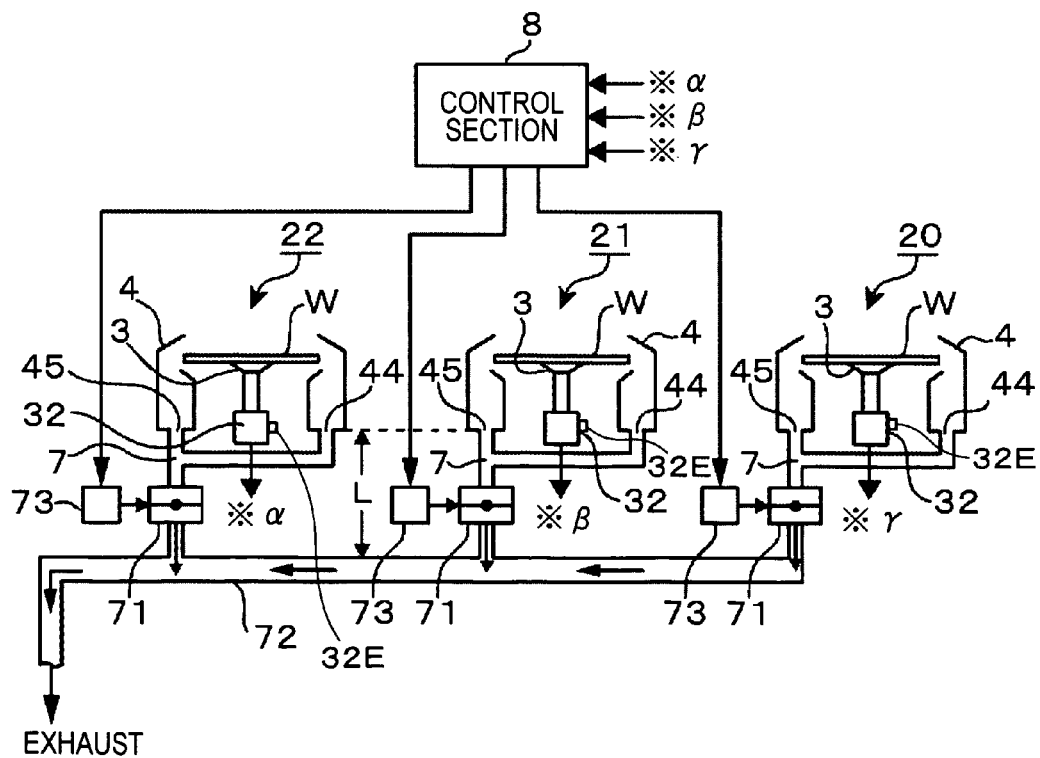
FIG. 4 is a configuration diagram showing exhaust pipes connected to the solution treatment sections in FIG. 2.

As shown in FIG. 4, in the solution treatment sections 20, 21, and 22, exhaust pipes 7 are connected to the two exhaust ports 44 and 45 provided in the inner region of the bottom portion of each cup body 4, respectively, and these exhaust pipes are joined at some midpoint to form one exhaust pipe 7. Dumpers 71 being exhaust rate adjustment sections are provided on the exhaust pipes 7, respectively to adjust the exhaust rates in the solution treatment sections 20, 21, and 22.

The exhaust pipes 7 are connected to a common exhaust pipe 72. It should be noted that a length L of the exhaust pipe 7 from a joint position where the plurality of exhaust pipes 7 are all joined (at this position, the common exhaust pipe 72 is provided) to the exhaust port 44 of the cup body 4 closest thereto is set within 150 mm, for example, 100 mm. The joint point where the plurality of exhaust pipes 7 are all joined lies within the common casing 11. In other words, the common exhaust pipe 72 is provided in the casing 11.

Drive portions 73 for adjusting the openings of the dampers 71 are connected to the dampers 71 respectively, and the drive portions 73 are controlled by a control section 8. The above-described drive mechanisms (spin chuck motors) 32 are also controlled by the control section 8 so that the numbers of rotations of the spin chucks 3 are controlled by the control section 8 as described later. The numbers of rotations of the spin chucks 3 are detected by encoders 32E provided on the motor shafts and loaded into the control section 8.

Figure 5:
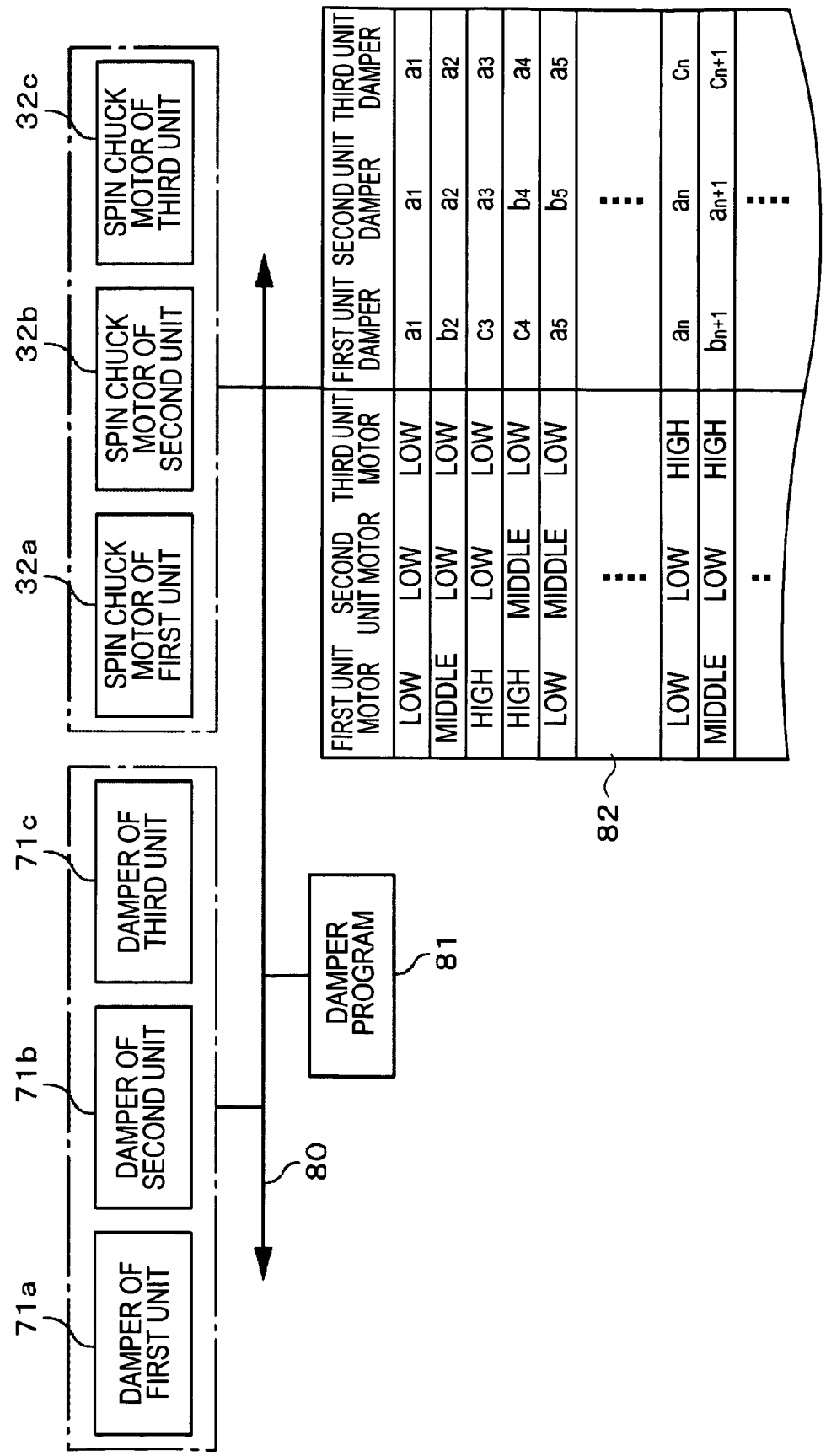
FIG. 5 is a block diagram showing a control section for use in the embodiment of the present invention.

Next, the control section 8 will be described in detail referring to FIG. 5. In FIG. 5, a numeral 80 denotes a bus to which a storage section and a CPU are connected, which are shown on a functional basis, presented in a block diagram.

A damper program 81 is designed to read a combination of set exhaust rates corresponding to a combination of the detected numbers of rotations of the spin chucks 3 referring to data in a later-described storage section 82 and to output an opening command to the drive portions 73 of the dampers 71 so as to create openings corresponding to the set exhaust rates. In this embodiment, since three drive mechanisms (spin chuck motors) 32 and dampers 71 are provided respectively, the spin chuck motors 32 are defined as a spin chuck motor 32a of a first unit, a spin chuck motor 32b of a second unit, and a spin chuck motor 32c of a third unit, and the dampers 71 are defined as a damper 71a of the first unit, a damper 71b of the second unit, and a damper 71c of the third unit, for convenience of explanation. Note that the numbers of rotations of the spin chucks 3 are determined by the numbers of rotations of the spin chuck motors 32.

The damper program 81 is stored in a storage medium, for example, a flexible disk, a compact disk, a magnet optical disk (MO), and the like, and installed in a computer being the control section 8 to be stored in a program storage portion.

The storage section 82 stores a data table in which the combinations of the numbers of rotations of the spin chucks 3 are associated with the combinations of the set exhaust rates of the exhaust pipes 7. In a particular explanation, three types of exhaust such as "high-rate exhaust," "medium-rate exhaust," and "low-rate exhaust" are performed, in accordance with the treatment purpose of the wafer W, in the solution treatment sections 20, 21, and 22 of the solution treatment apparatus 10. It should be noted that the terms such as "high, medium, and low" and the like are used for convenience of explanation.

The low-rate exhaust here means exhaust performed during a process called spin coating in which the treatment solution or the cleaning solution dropped on the central portion of the surface of the wafer W is spread in a radial direction of the wafer W by centrifugal force, and the number of rotations of the spin chuck 3 is, for example, 1000 rpm and the treatment period is, for example, 2 seconds in this process. On the other hand, the high-rate exhaust means exhaust performed during a process called shake-off drying in which the treatment solution or the cleaning solution applied on the surface of the wafer W is dried up, and the number of rotations of the spin chuck 3 is, for example, 2500 rpm and the treatment period is, for example, 30 seconds in this process. The remaining medium-rate exhaust means exhaust performed during a process called side rinse in which the peripheral portion of the wafer W is rinsed with the rinse solution, and the number of rotations of the spin chuck 3 is, for example, 1500 rpm and the treatment period is, for example, 8 seconds in this process. Note that after the side rinse is performed, a process called shake-off drying for drying the peripheral portion of the wafer W is performed, in which the number of rotations of the spin chuck 3 is, for example, 2000 rpm and the treatment period is, for example, 5 seconds in this process. The shake-off drying performed after the side rinse shall be included in the above-described medium-rate exhaust in this example.

The set exhaust rates of the exhaust pipe 7 in the above-described three exhausts are determined depending on the opening of the damper 71, leading to a relationship such as the opening of the damper 71 at the low-rate exhaust<the opening of the damper 71 at the medium-rate exhaust<the opening of the damper 71 at the high-rate exhaust. More specifically, assuming that the set exhaust rate at the low-rate exhaust is defined as a, the set exhaust rate at the medium-rate exhaust is defined as b, and the set exhaust rate at the high-rate exhaust is defined as c, the set exhaust rates establishes a relationship of a<b<c. The above relationship is shown, in FIG. 5, as data in which combinations of exhausts (high-rate exhaust, medium-rate exhaust, low-rate exhaust) corresponding to the numbers of rotations of the spin chuck motors 32a to 32c of the first to third units are associated with combinations of the set exhaust rates (a, b, c) of the dampers 71a to 71c of the first to third units. Incidentally, the set exhaust rates (a, b, c) differ depending on the combination of exhaust states in the cup bodies 4 in the first to third units, so that, in the case of the exhaust state in which the first unit is at the medium-rate exhaust, the second unit is at the low-rate exhaust, and the third unit is at the low-rate exhaust, the set exhaust rates are set to (b2, a2, a2), while, in the case of the exhaust state in which the first unit is at the low-rate exhaust, the second unit is at the medium-rate exhaust, and the third unit is at the low-rate exhaust, the set exhaust rates are set to (a5, b5, a5).

Next, operation in the above-described embodiment will be described based on the flow of the wafer when the solution treatment apparatus is incorporated in a coating and developing apparatus. In this example, a wafer W will be carried by a main arm (described later) from a shelf unit including a plurality of transfer stages, in the order of a cooling unit, the solution treatment apparatus 10, and a heating unit, as described in detail in the later-described coating and developing apparatus.

First, the main arm receives a wafer W at the top of a lot mounted on the transfer stage in the shelf unit and carries it to the cooling unit. Subsequently, the main arm A4 carries the wafer W, which has been subjected to a predetermined treatment in the cooling unit, to the solution treatment section 20 in the solution treatment apparatus 10 via the carry-in/out port 18. The wafer W carried in the solution treatment section 20 is supported on its rear face by the raising and lowering pins (not shown) which can rise and lower, and horizontally held on the spin chuck 3 when the raising and lowering pins lower. The main arm A4 after the completion of the carriage of the wafer W to the solution treatment section 20 moves to the shelf unit in order to receive a next wafer W and receives the next wafer W at the transfer stage on which the wafer W is mounted and then carries it to the cooling unit, so that the wafer W is carried, at this time, to the solution treatment section 21 in a manner similarly to the above. Thus, the main arm A4 moves in accordance with a carriage schedule, in which when a wafer W carried into the cooling unit will be carried, at this time, to the solution treatment section 22.

Figure 6:
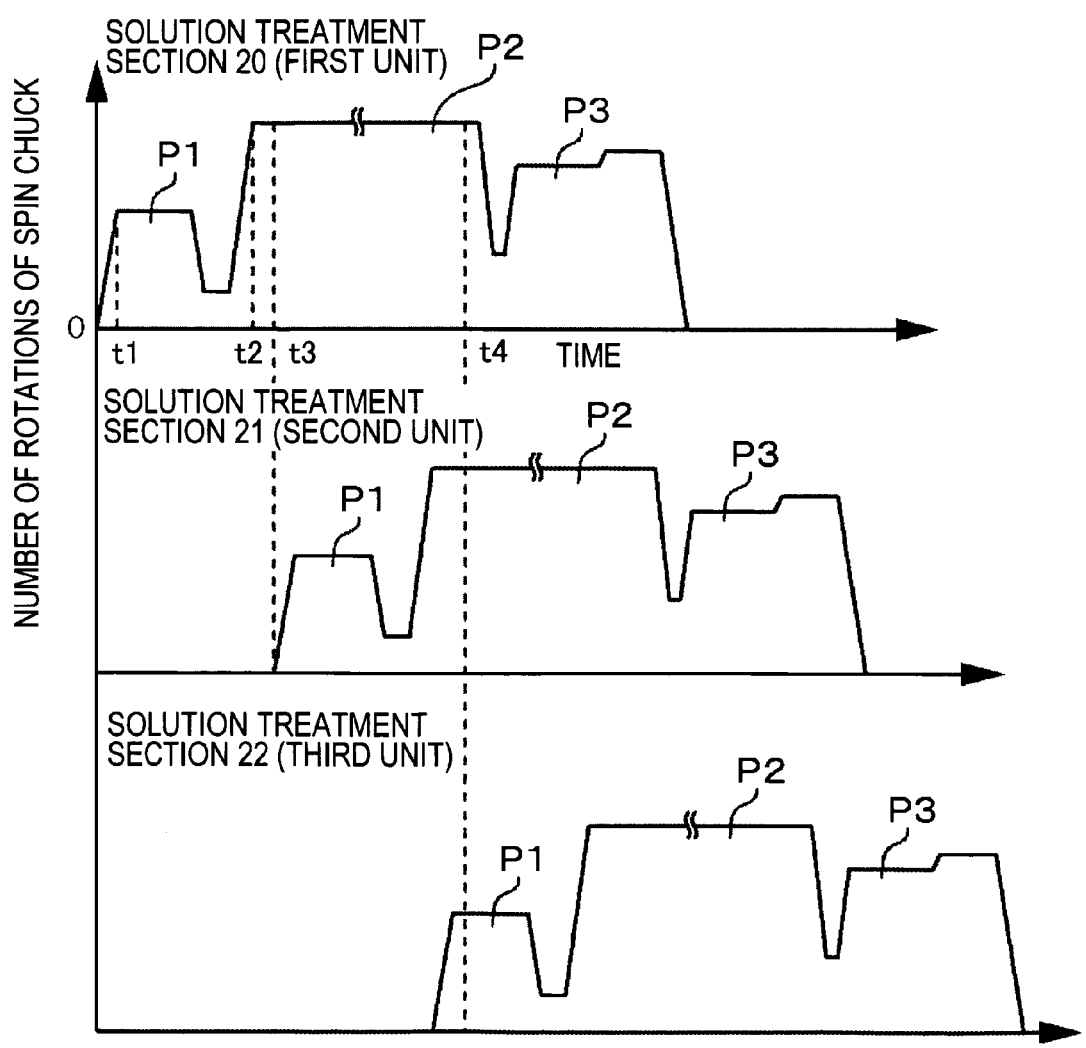
FIG. 6 is an explanatory diagram showing processing states in the solution treatment sections in the embodiment of the present invention.

In this manner, the scheduled carriage is performed, in which wafers W are sequentially taken into the solution treatment section 20 of the first unit, the solution treatment section 21 of the second unit, the solution treatment section 22 of the third unit, the solution treatment section 20 of the first unit, the solution treatment section 21 of the second unit, and so on at predetermined timings in the solution treatment apparatus 10, resulting in, for example, the patterns of the numbers of rotations of the spin chucks as shown in FIG. 6.

As shown in FIG. 6, spin coating is first performed at time t1 for the wafer W carried into the solution treatment section 20 of the first unit, in which the treatment solution is dropped onto the central portion of the wafer W by the treatment solution nozzle 12a, and the spin chuck 3 is then rotated at the number of rotations of 1000 rpm to spread the treatment solution in the radial direction of the wafer W by centrifugal force (Process P1), the treatment period being, for example, 2 seconds. Subsequently, the treatment solution applied on the surface of the wafer W is shaken off by rotating the spin chuck 3 at the number of rotations of 2500 rpm to thereby dry the wafer W (Process P2), the treatment period being, for example, 30 seconds. Thereafter, the rinse solution is applied to the peripheral portion of the wafer W by the rinse nozzle 6, and the spin chuck 3 is then rotated at the number of rotations of 1500 rpm to thereby perform side rinse to rinse the peripheral portion of the wafer W, the treatment period being, for example, 8 seconds. After the side rinse is performed, the spin chuck 3 is rotated at the number of rotations of 2000 rpm to shake off the rinse solution to thereby dry the wafer W, the treatment period being, for example, 5 seconds. Note that the side rinse and shake-off drying are illustrated as Process P3 for convenience of explanation.

Explaining adjustment of the openings of the dampers 71 of the solution treatment sections 20, 21, and 22 when a sequence of treatment is performed in the solution treatment section 20 of the first unit, no wafers W are carried in the solution treatment section 21 of the second unit and the solution treatment section 22 of the third unit at time t1 being the start time of Process P1, and therefore 1000 rpm, 0 rpm, and 0 rpm are loaded into the control section 8 as values of the numbers of rotations of the spin chucks 3 of the first to third units. The damper program 81 evaluates 1000 rpm as the low-rate exhaust, so that the combination of the set exhaust rates of the first to third units results in "low-rate exhaust," "no exhaust," and "no exhaust." The damper program 81 then reads, from the data table stored in the storage section 82, a combination of the openings of the dampers 71a to 71c of the respective units corresponding to the above combination, and adjusts the openings of the dampers 71a to 71c. For example, the exhaust rate corresponding to the low exhaust rate is on the order of 1.0 m$^3$/min.

Subsequently, Process P2 is started at time t2, and the damper program 81 evaluates the number of rotations of 2500 rpm of the spin chuck 3 of the first unit as the high-rate exhaust, and similarly adjusts the openings of the dampers 71a to 71c referring to the data table stored in the storage section 82, thereby setting the exhaust rate to about 3.0 m$^3$/min.

Then, a wafer W is carried into the solution treatment section 21 of the second unit at time t3, and Process P1 being a process of extending the resist solution is started. The number of rotations of the spin chuck 3 of the second unit at this time is 1000 rpm that is evaluated as the "low-rate exhaust" as has been described, so that the combination of the set exhaust rates of the first to third units results in a combination of "high-rate exhaust," "low-rate exhaust," and "no exhaust." The damper program 81 then reads, from the data table stored in the storage section 82, a combination of the openings of the dampers 71a to 71c of the respective units corresponding to the above combination, and adjusts the openings of the dampers 71a to 71c.

Then, a wafer W is also carried into the solution treatment section 22 of the third unit at time t4, and, also in this case, the openings of the dampers 71a to 71c are similarly adjusted using the data table stored in the storage section 82. Incidentally, the numbers of rotations 1500 rpm and 2000 rpm of the spin chuck 3 in Process P3 in which the side rinse and shake-off drying thereafter are performed for the wafer W are treated as the "medium-rate exhaust" in this example. The set exhaust rate of the "medium-rate exhaust" is on the order of 2.0 m$^3$/min. While the case of the number of rotations of the spin chuck 3 being 0 rpm is defined as "no exhaust" in the above embodiment, the opening of the damper 71 may be adjusted to exhaust the cup body 4 even for the case of "no exhaust," because downflow of a clean gas is formed in the solution treatment apparatus 10.

According to the above embodiment, the three exhaust pipes 7 connected to the three cup bodies 4 surrounding the respective spin chucks 3 are joined together for common use to form a common exhaust pipe 72, so that the openings of the dampers 71a to 71c being the exhaust rate adjustment sections provided on the exhaust pipes 7 are adjusted referring to the data table in which the combinations of the numbers of rotations of the spin chucks 3 are associated with the combinations of the set exhaust rates of the exhaust pipes 7 when the solution treatment is performed such as spin-coating, shake-off drying, and side rinse by rotating the wafers W by the spin chucks 3, and therefore the cup bodies 4 can be exhausted at intended exhaust rates at all times independently of the state where the wafer W in which cup body 4 is subjected to which process (P1 process, P2 process, or P3 process).

In other words, focusing attention on one cup body 4, the cup body 4 can be exhausted at an appropriate, not too high nor too low, intended exhaust rate irrespective of the states of other cup bodies 4 in each process. This can suppress adhesion of mist to the wafer W and stabilize the film thickness of a thin film such as a resist on the wafer W. In addition, the exhaust pipes 7 connected to the cup bodies 4 are joined together for common use near the cup bodies 4 to be provided as the common exhaust pipe 72 in the solution treatment apparatus 10, whereby the space required for routing the exhaust pipes can be decreased as compared to the case in which the exhaust pipes 7 connected to the cup bodies 4 are separately routed to the outside, resulting in reduced space of the solution treatment apparatus 10. Further, the cup bodies 4 are exhausted at the predetermined exhaust rates as described above, thereby eliminating excessive exhaust, so that the exhaust volume of the whole apparatus can be reduced to reduce the exhaust volume of plant facility.

In the above embodiment, the method for determining the number of rotations of each spin chuck 3 is not limited to detect the number of rotations of each spin chuck 3, but may be realized by writing, into a memory, what kind of treatment is currently being performed in each cup body 4, that is, the state (treatment), such as spin-coating being performed or shake-off drying being performed in the above-described example, reading the state in each cup body 4 from the memory, and reading the number of rotations of the spin chuck 3 corresponding to the state from the table in which the state in the cup body is associated with the number of rotations in advance.

Figure 7:
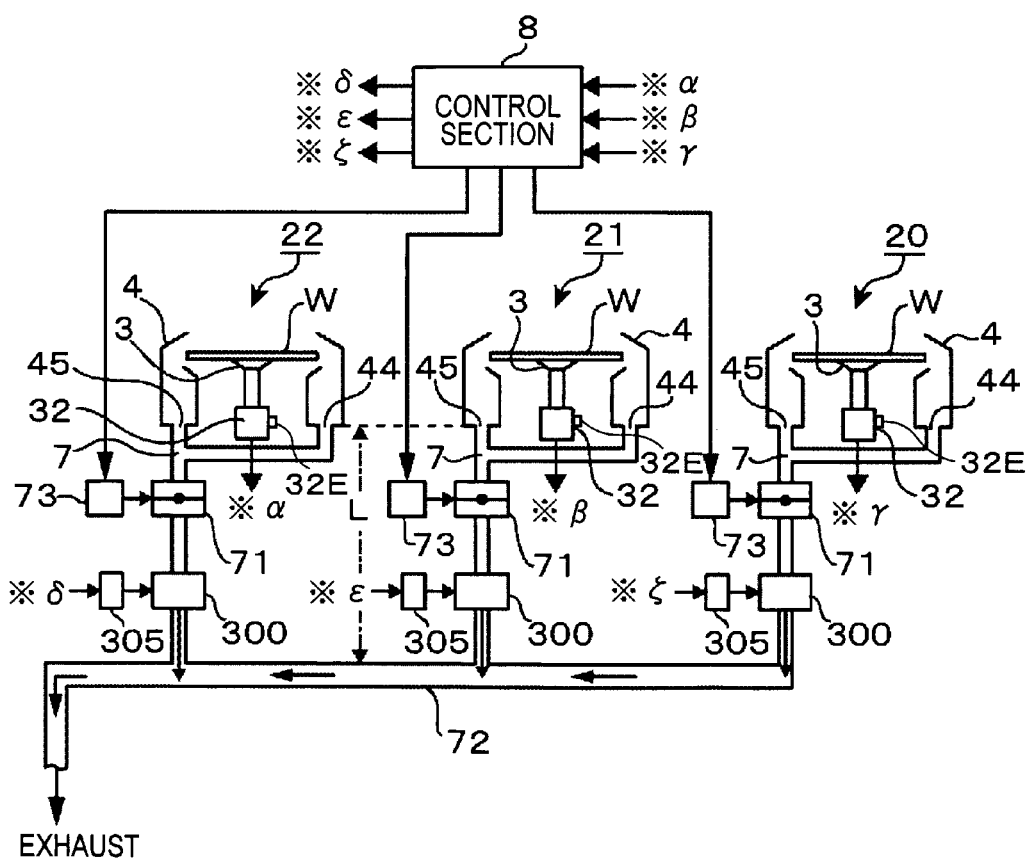
FIG. 7 is a configuration diagram showing another configuration of the exhaust pipes connected to the solution treatment sections in FIG. 2.

Next, another embodiment of the present invention will be described. This embodiment has the same configuration as the above-described embodiment except that exhaust rate amplification mechanisms 300, for example, Transvectors (trade name), are provided on exhaust pipes 7 between dampers 71 and a common exhaust pipe 72, and that the openings of the dampers 71 are fixed to the openings corresponding to the three exhaust states, that is, the low-rate exhaust, the medium-rate exhaust, and the high-rate exhaust respectively without use of the above-described data table stored in the storage section 82 as shown in FIG. 7. For example, for a solution treatment section 20 of a first unit, the number of rotations of a spin chuck 3 of the first unit is associated with the openings of the dampers 71 in advance. For other solution treatment sections 21 and 22, the openings of the dampers 71 are similarly set in advance. Note that the number of rotations referred here also includes, for example, a case in which the number of rotations has a range so that the opening of the damper 71 is fixed to a certain value for the number of rotations within p1 to p2.

Figure 8A:
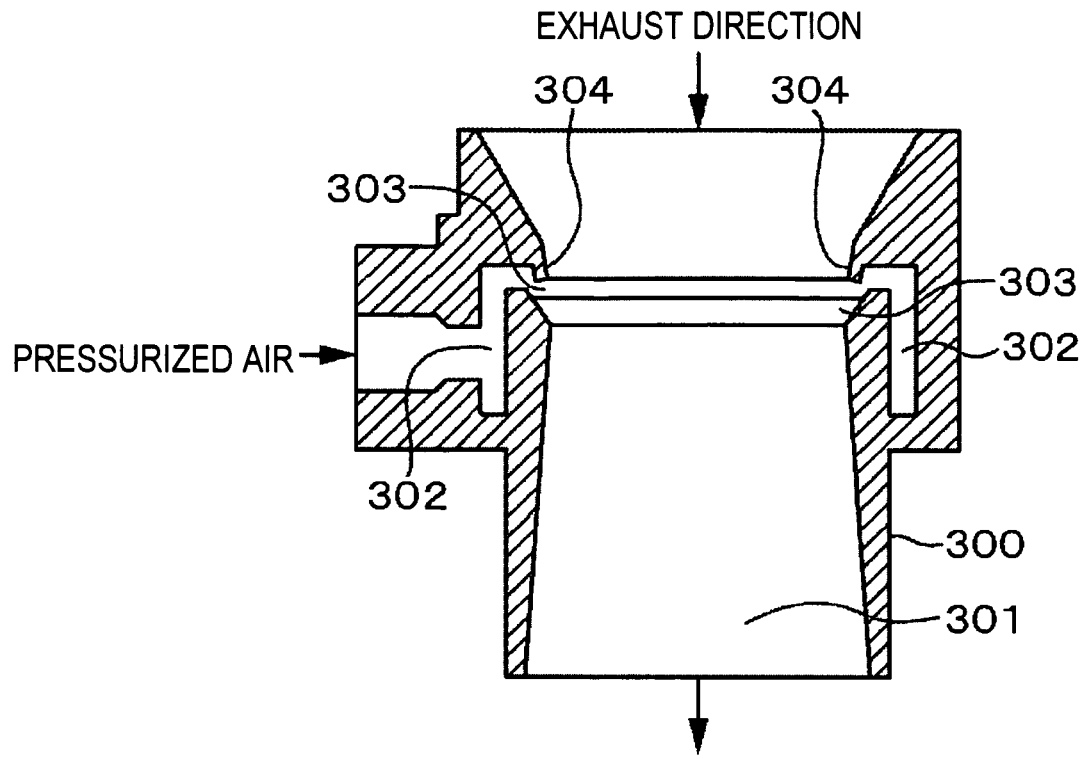
FIGS. 8A and 8B are cross-sectional views of an exhaust rate amplification mechanism for use in the embodiment of the present invention.
Figure 8B:
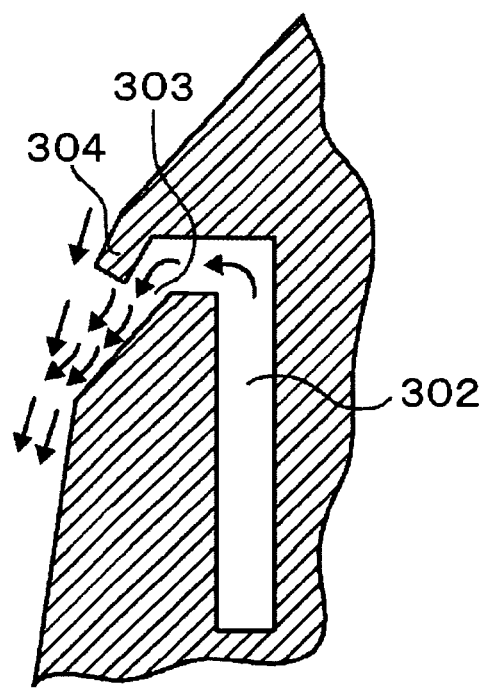

FIG. 8A is a cross-sectional view of the exhaust rate amplification mechanism 300 in which a flow-in chamber 302 crooked in an L-shape in a manner to surround the periphery of an exhaust path 301 is formed in a side face portion of the mechanism 300, and a small protruding portion 304 is formed near an opening potion 303 of the flow-in chamber 302. Further, a pressurization section 305 is connected to the exhaust rate amplification mechanism 300 as shown in FIG. 7, so that pressurized air is flowed into the flow-in chamber 302 by the pressure supply potion 305. Further, the pressurization section 305 is controlled by the control section 8. As shown in FIG. 8B, when the pressurized air is flowed into the flow-in chamber 302 by the pressurization section 305, the air is turned into an exhaust direction by the protruding portion 304 formed near the opening portion 303 of the flow-in chamber 302 to reduce in speed, resulting in amplified air flow rate.

Subsequently, operation in this embodiment will be described. For example, the low-rate exhaust, the high-rate exhaust, and the high-rate exhaust will be performed in the first solution treatment section 20, the second solution treatment section 21, and the third solution treatment section 22, respectively. In this case, the opening of the second damper 71 and the opening of the third damper 71 are set to the opening corresponding to the high-rate exhaust, and the opening of the first damper 71 is set to the opening corresponding to the low-rate exhaust. However, since the solution treatment apparatus 10 has a moderate exhaust ability and the distances from the cup bodies 4 connected to the common exhaust pipe 72 via the exhaust pipes 7 are different, there may occur a phenomenon that the intended exhaust rates in the cup bodies 4 can be attained in the second solution treatment section 21 and the third solution treatment section 22, while the intended exhaust rate in the cup body 4 cannot be attained in the first solution treatment section 20. In short, an intended exhaust rate, for example, 1.0 m$^3$/min is not reached in the cup body 4 of the first solution treatment section 20. Hence, the above-described exhaust rate amplification mechanism 300 is used to supplement the shortage of the exhaust rate.

Such shortage of the exhaust rate may occur in the high-rate exhaust and in the medium-rate exhaust. Therefore, the combination of operating conditions of the solution treatment sections 20 to 22, and the shortages of the exhaust rates of the solution treatment sections 20 to 22 when the exhaust rates are adjusted only by the dampers 71, that is, when the openings are fixed to the operating states as described above, are grasped in advance and the pressurization rates from the pressurization sections 305 are set to supplement the shortages. Describing here examples of the set exhaust rates corresponding to the respective exhaust states, the set exhaust rates in the high-rate exhaust, the medium-rate exhaust, and the low-rate exhaust are, for example, 3.0 m$^3$/min, 2.0 m$^3$/min, and 1.0 m$^3$/min respectively.

According to this embodiment, in the case in which the openings of the dampers are fixed to the openings corresponding to the three exhaust states, that is, the high-rate exhaust, the medium-rate exhaust, and the low-rate exhaust, when the intended exhaust rate cannot be attained in any of the cup bodies 4, the use of the already-described exhaust rate amplification mechanism 300 can supplement the shortage of the exhaust rate. Therefore, even with a low ability of the exhaust rate of the plant facility, the gasses can be exhausted at appropriate exhaust rates at all times in the solution treatment sections 20 to 22. In other words, the exhaust volume of the plant facility can be reduced (mode specifically, the exhaust volume of a central exhaust apparatus incorporated in a plant or the like can be reduced). Incidentally, a configuration may be employed in which the exhaust rate amplification mechanism 300 is provided on the exhaust pipe 7 between the cup body 4 and the damper 71. Such a configuration can also offer the effects similar to the above. In addition, a blower fan may be used as the exhaust rate amplification mechanism 300.

Figure 9:
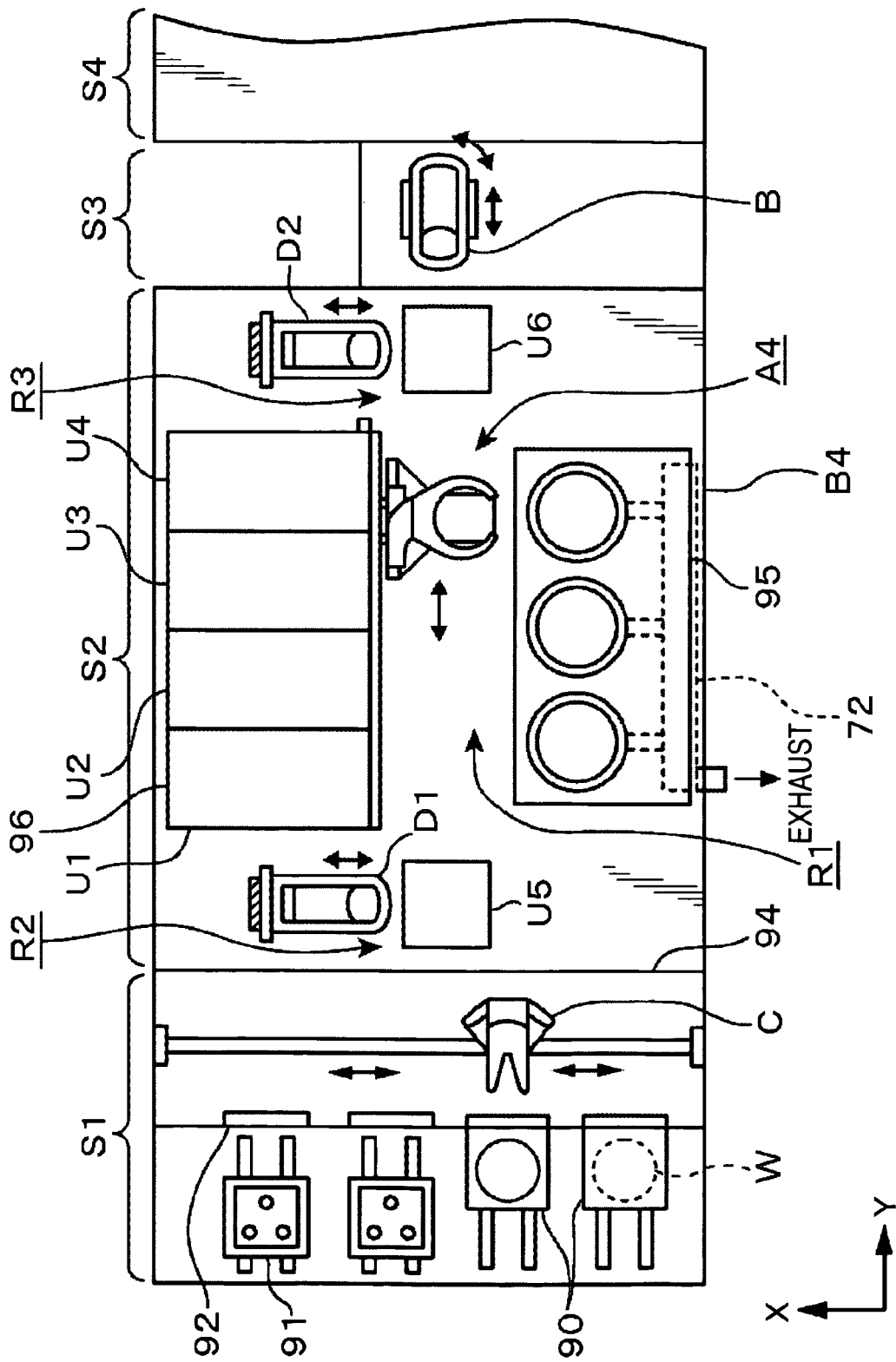
FIG. 9 is a plan view of a coating and developing apparatus in which the solution treatment apparatus according to the embodiment of the present invention is incorporated.
Figure 10:
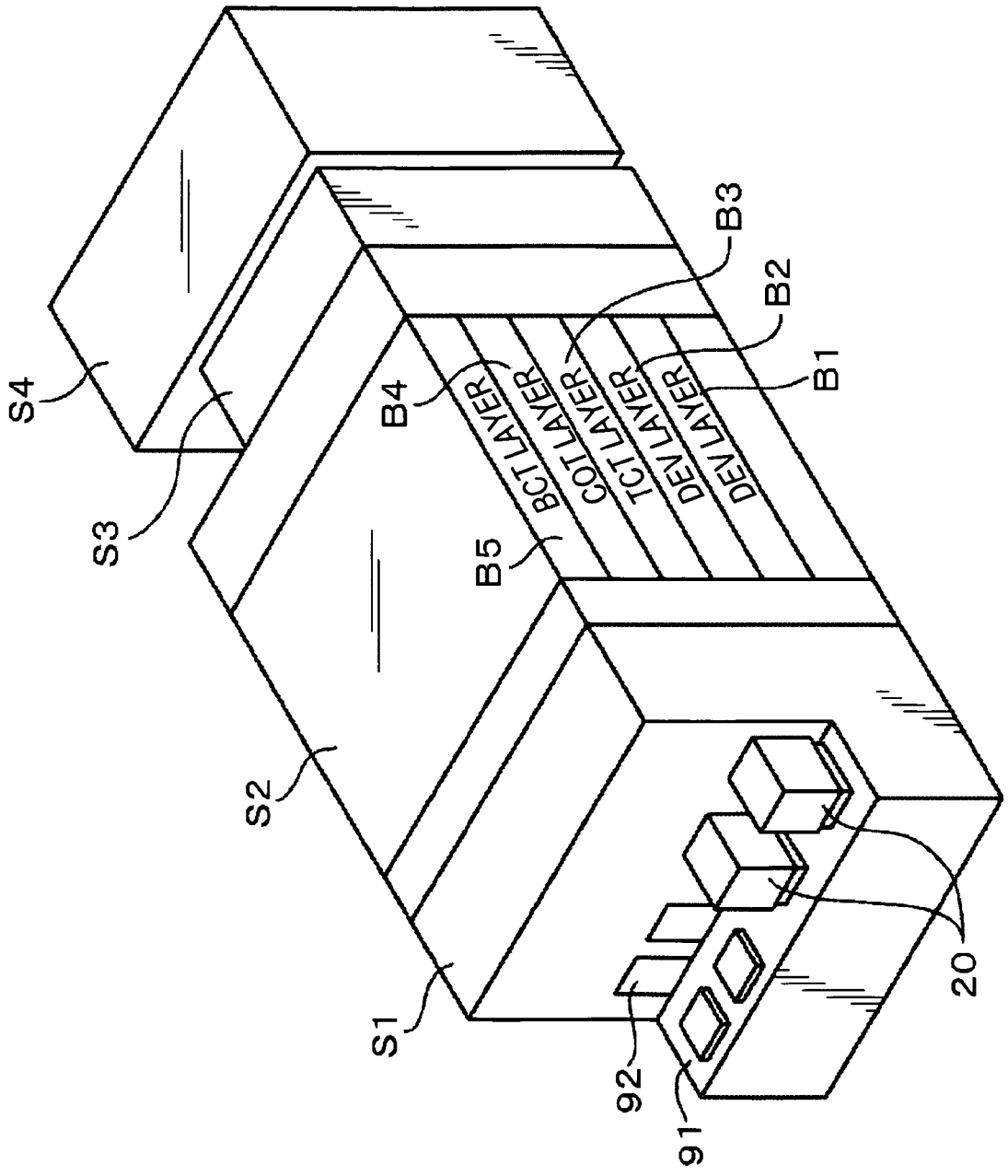
FIG. 10 is a perspective view of the coating and developing apparatus of FIG. 9.
Figure 11:
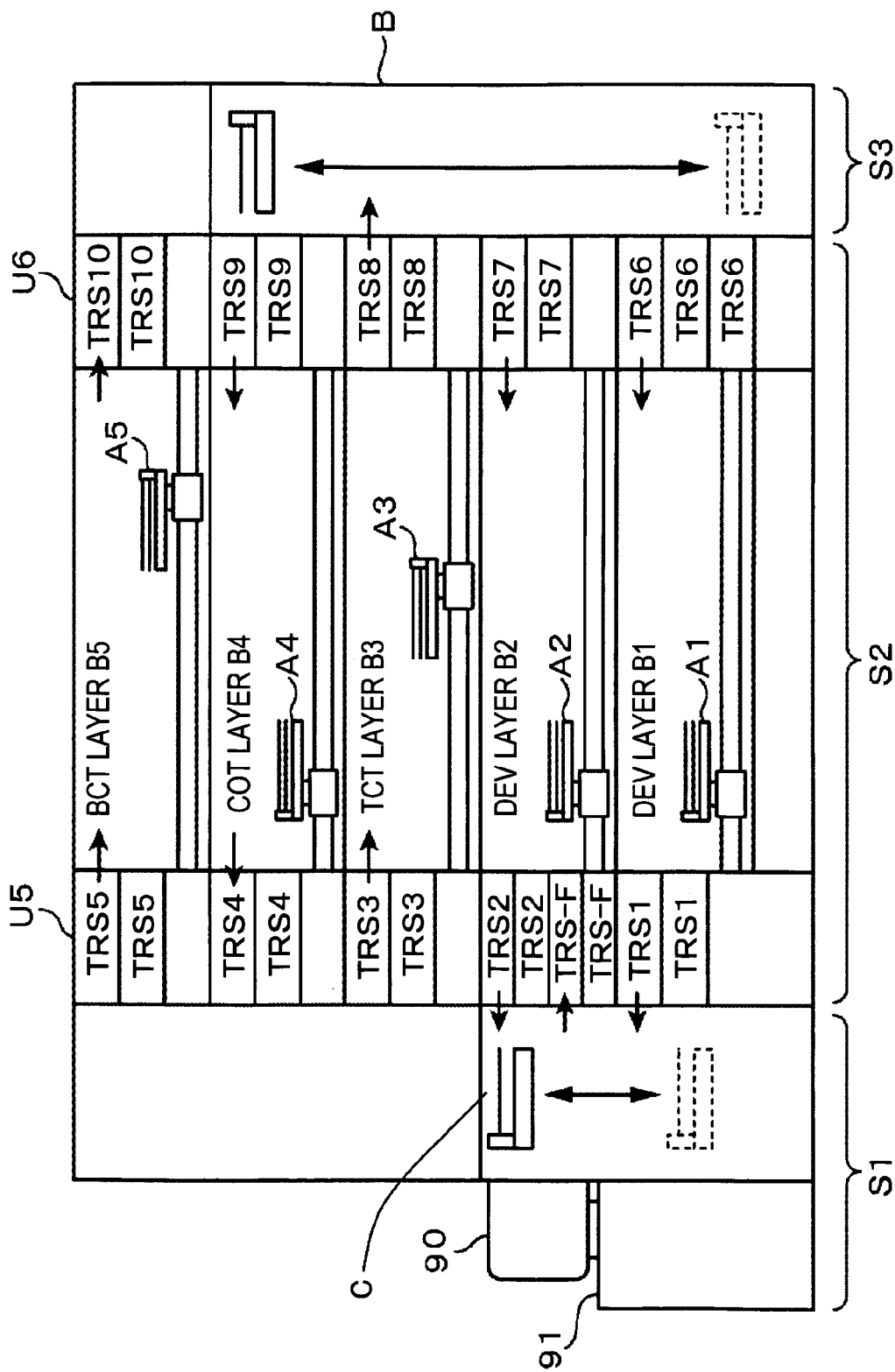
FIG. 11 is a side cross-sectional view of the coating and developing apparatus of FIG. 9.

Subsequently, an embodiment where the solution treatment apparatus 10 of the present invention is applied to a resist pattern forming apparatus being a coating and developing apparatus will be described. FIG. 9 is a plan view of the resist pattern forming apparatus, FIG. 10 is a schematic perspective view of the same, and FIG. 11 is a schematic side view of the same. This apparatus comprises a carrier block S1 for carrying in/out a carrier 90 in which, for example, 13 wafers W being substrates are housed, a processing block S2 configured by a plurality of, for example, five unit blocks B1 to B5 which are vertically arranged, an interface block S3, and an aligner S4.

In the carrier block S1, a mounting table 91 on which a plurality of carriers 90 can be mounted, opening/closing portions 92 provided in a front wall as seen from the mounting table 91, and a transfer arm C for taking the wafer W out of the carrier 90 via the opening/closing portion 92, are provided. The transfer arm C is configured to freely move back and forth, freely rise and lower, freely rotatable about the vertical axis, and freely move in a direction in which the carriers 90 are arranged, so as to transfer the wafer W to/from later-described transfer stages TRS1 and TRS2 of the unit blocks B1 and B2.

To the back side of the carrier block S1, the processing block S2 is connected, its periphery being surrounded by a casing 94. Assignment in the processing block S2 is such that two lower-side tiers are the first and second unit blocks (DEV layers) B1 and B2 for performing developing treatment, and other tiers are a third unit block (TCT layer) B3 for performing formation treatment of an anti-reflection film to be formed on the upper layer side of the resist film, a fourth unit block (COT layer) B4 for performing coating treatment of the resist solution, and a fifth unit block (BCT layer) B5 for performing formation treatment of an anti-reflection film to be formed on the lower layer side of the resist film, from the lower side in this example. The DEV layers B1 and B2 correspond to unit blocks for developing treatment, and the TCT layer B3, the COT layer B4, and the BCT layer B5 correspond to unit blocks for forming a coating film.

Subsequently, configurations of the first to fifth unit blocks B (B1 to B5) will be described. These unit blocks B1 to B5 include solution treatment units each for applying a treatment solution to the wafer W, various kinds of heating and cooling processing units for performing pre-processing and post-processing for the treatment performed in the solution treatment units, and main arms A1 to A5 being dedicated carrier means for delivering the wafer W to/from the various kinds of heating and cooling processing units.

First, the COT layer B4 shown in FIG. 9 is described below by way of example. At almost the center of the COT layer B4, a carrier region R1 for the wafer W is formed in a direction of the length of the COT layer B4 (a Y-axis direction in the drawing) to connect the carrier block S1 to the interface block S3.

On both sides of the carrier region R1 as seen from the carrier block S1 side, a coating unit 95 including a plurality of coating sections each for performing coating treatment of the resist is provided on the right side as seen from the front side (carrier block S1 side) toward the back side. In short, the coating unit 95 is an apparatus for applying the resist solution to the wafer W. In this example, the solution treatment apparatus 10 described with FIGS. 1A and 1B through FIG. 4 corresponds to the coating unit 95, and the solution treatment sections 20, 21, and 22 correspond to the coating sections. Further, the resist solution will be discharged from the discharge port formed in the treatment solution nozzle 12a. In addition, four shelf units U1, U2, U3, and U4, in each of which the heating and cooling units are multi-tiered, are provided in order on the left side from the front side of the COT layer B4 toward the back side, and have a configuration in which various kinds of processing units for performing pre-processing and post-processing for the treatment performed in the coating unit 95 are layered in a plurality of tiers, for example, two tiers. In such a manner, the carrier region R1 is partitioned, so that, for example, a clean air is jetted into the partitioned carrier region R1 to exhaust gas therein so as to suppress floating of particles within the region.

The above-described various kinds of units for performing pre-processing and post-processing include, for example, a cooling unit (COL) for adjusting the wafer W to a predetermined temperature before the application of the resist solution, a heating unit (CHP) called, for example, a pre-baking unit for performing heating processing of the wafer W after the application of the resist solution, an edge exposure apparatus (WEE) for selectively exposing light only to the edge portion of the wafer W, and so on. Further, the processing units such as the cooling unit (COL), the heating unit (CHP), and so on are housed in processing containers 96 respectively, and each of the shelf units U1 to U4 is configured such that the processing containers 96 are layered in two tiers, and a surface facing the carrier region R1 of the processing container 96 is formed with a carry-in/out port 97 through which the wafer W is carried in/out.

Within the carrier region R1, the main arm A4 is provided. The main arm A4 is configured to deliver the wafer among all modules (places where the wafer W is placed) in the COT layer B4, for example, among the processing units in the shelf units U1 to U4, the coating unit 95, and units in later-described shelf unit U5 and shelf unit U6, and therefore the main arm 4 is configured to freely move back and forth, freely rise and lower, freely rotatable about the vertical axis, and freely move in the Y-axis direction.

In addition, a region of the carrier region R1 adjacent to the carrier block S1 is a first wafer delivery region R2, and in the region R2, the shelf unit U5 is provided at a position where the transfer arm C and the main arm A4 can access, and a first delivery arm D1 forming a first substrate delivery means for delivering the wafer W to the shelf unit U5 is provided as shown in FIG. 9 and FIG. 11.

In the shelf unit U5, as shown in FIG. 11, the unit blocks B1 to B5 each include one or more, for example, two first transfer stages TRS1 to TRS5 to constitute a first transfer stage group in which the first transfer stages are multi-tiered in this example, so as to transfer the wafers W to/from the main arms A1 to A5 in the unit blocks B1 to B5. Further, the first delivery arm D1 is configured to freely move back and forth and freely rise and lower to be able to deliver the wafer W to the first transfer stages TRS1 to TRS5. The first transfer stages TRS1 and TRS2 of the first and second unit blocks B1 and B2 are configured to transfer the wafers W to/from the transfer arm C in this example and correspond to transfer stages for the carrier block.

In addition, a region of the carrier region R1 adjacent to the interface block S3 is a second wafer delivery region R3, and in the region R3, the shelf unit U6 is provided at a position where the main arm A4 can access, and a second delivery arm D2 forming a second substrate delivery means for delivering the wafer W to the shelf unit U6 is provided as shown in FIG. 11.

In the shelf unit U6, as shown in FIG. 11, the unit blocks B1 to B5 each include one or more, for example, two second transfer stages TRS6 to TRS10 to constitute a second transfer stage group in which the second transfer stages are multi-tiered in this example, so as to transfer the wafers W to/from the main arms A1 to A5 in the unit blocks B1 to B5. The second delivery arm D2 is configured to freely move back and forth and freely rise and lower to be able to deliver the first wafer W to the second transfer stages TRS6 to TRS10. As described above, the configuration in this embodiment is made such that the above-described first delivery arm D1 and second delivery arm D2 can freely deliver the wafers W via the first transfer stages TRS1 to TRS5 and the second transfer stages TRS6 to TRS10 respectively, between the unit blocks B1 to B5 which are five-tiered.

Subsequently, other unit blocks B will be briefly described. The DEV layers B1 and B2 are similarly configured, in each of which a developing unit including a plurality of developing sections each for performing developing treatment for the wafer W is provided, and the shelf units U1 to U4 are configured similarly to the COT layer B4 except that a heating unit (PEB) called a post-exposure baking unit for heat-processing the wafer W after exposure, a cooling unit (COL) for adjusting the wafer W to a predetermined temperature after the processing in the heating unit (PEB), a heating unit (POST) called a post-baking unit for heat-processing the wafer W after developing treatment to evaporate moisture thereon, are provided.

In the DEV layers B1 and B2, the main arms A1 and A2 respectively deliver the wafers W to/from the first transfer stages TRS1 and TRS2, the second transfer stages TRS6 and TRS7, the developing unit, and the processing units of the shelf units U1 to U4.

Further, in the TCT layer B3, a second anti-reflection film forming unit is provided which includes a plurality of second anti-reflection film forming sections each for performing formation treatment of a second anti-reflection film for the wafer W. In other words, the second anti-reflection film forming unit is an apparatus for applying a treatment solution for the anti-reflection film for the wafer W after application of the resist solution. In this example, the solution treatment apparatus 10 described with FIGS. 1A and 1B through FIG. 4 corresponds to the second anti-reflection film forming unit, and the solution treatment sections 20, 21, and 22 correspond to the second anti-reflection film forming sections. Further, the treatment solution for the anti-reflection film will be discharged from the discharge port formed in the treatment solution nozzle 12a. In addition, the shelf units U1 to U4 are configured similarly to the COT layer B4 except that a cooling unit (COL) for adjusting the wafer W to a predetermined temperature before the anti-reflection film formation treatment and a heating unit (CHP) for heat-processing the wafer W after the anti-reflection film formation treatment are provided. In the TCT layer B3, the main arm A3 delivers the wafer W to/from the first transfer stage TRS3, the second transfer stage TRS8, the second anti-reflection film forming unit, and the processing units of the shelf units U1 to U4.

Further, in the BCT layer B5, a first anti-reflection film forming unit is provided which includes a plurality of first anti-reflection film forming sections each for performing formation treatment of a first anti-reflection film for the wafer W. In other words, the first anti-reflection film forming unit is an apparatus for applying a treatment solution for the anti-reflection film for the wafer W before application of the resist solution. In this example, the solution treatment apparatus 10 described with FIGS. 1A to 1B through FIG. 4 corresponds to the first anti-reflection film forming unit, and the solution treatment sections 20, 21, and 22 correspond to the first anti-reflection film forming sections. Further, the treatment solution for the anti-reflection film will be discharged from the discharge port formed in the treatment solution nozzle 12a. In addition, the shelf units U1 to U4 are configured similarly to the COT layer B4 except that a cooling unit (COL) for adjusting the wafer W to a predetermined temperature before the anti-reflection film formation treatment, a heating unit (CHP) for heat-processing the wafer W after the anti-reflection film formation treatment are provided but the edge exposure apparatus (WEE) is not provided. In the fifth unit block B5, the main arm A5 delivers the wafer W to/from the first transfer stage TRS5, the second transfer stage TRS10, the first anti-reflection film forming unit, and the processing units of the shelf units U1 to U4.

It should be noted that, these processing units are not limited to the heating units (CHP, PEB, POST), the cooling unit (COL), and the edge exposure apparatus (WEE), but other processing units may be provided, and the number of units to be installed is determined on consideration of processing periods in the processing units in an actual apparatus.

On the other hand, the aligner S4 is connected to the back side of the shelf unit U6 in the processing block S2 via the interface block S3. In the interface block S3, an interface arm B is provided for delivering the wafer W to the shelf unit U6 in the processing block S2 and the aligner S4. This interface arm B forms a carrier means for the wafer W, intervening between the processing block S2 and the aligner S4, and is configured to freely move back and forth, freely rise and lower, and freely rotatable about the vertical axis, so as to deliver the wafer W to the second transfer stages TRS6 to TRS9 in the first to fourth unit blocks B1 to B4 in this example. In this example, the second transfer stages TRS6 to TRS9 correspond to transfer stages for the interface block.

Further, the interface arm B may be configured to deliver the wafer W to the second transfer stages TRS6 to TRS10 of all of the unit blocks B1 o B5, in which case the second transfer stages TRS6 to TRS10 correspond to transfer stages for the interface block.

Figure 12:
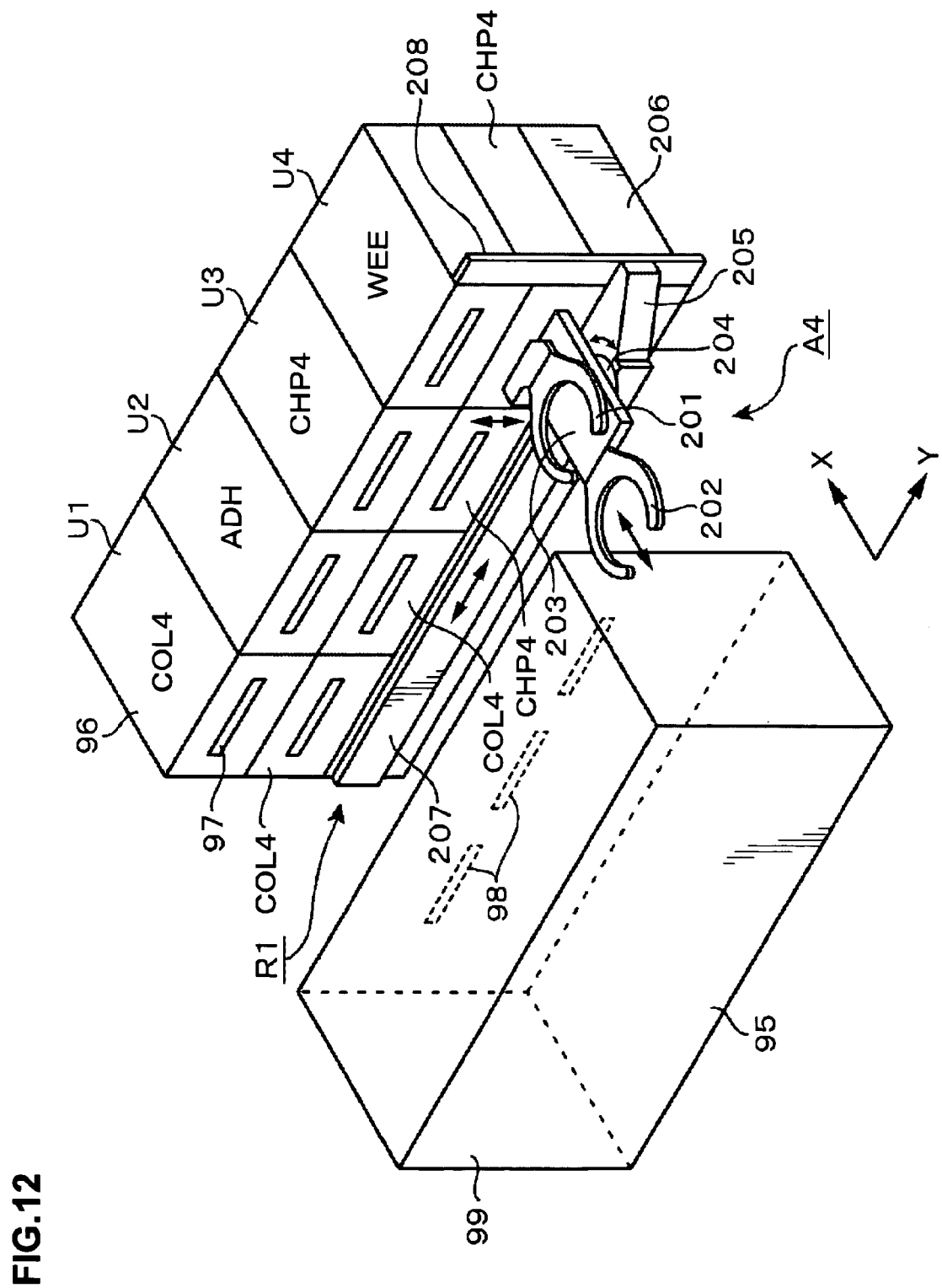
FIG. 12 is a perspective view showing a coating unit, shelf units and a carrier means in the coating and developing apparatus of FIG. 9.

Subsequently, briefly explaining the main arms A (A1 to A5), the main arm A includes two arms 201 and 202 for supporting the edge region on the rear face side of the wafer W as shown in FIG. 12, and the arms 201 and 202 are configured to freely move back and forth separately from each other along a base 203. The base 203 is configured to freely rotate about the vertical axis by means of a rotation mechanism 204, freely move in the Y-axis direction along a Y-axis rail 207 attached to a surface facing the carrier region R1 of a base 206 supporting the shelf units U1 to U4, and freely rise and lower along a rising and lowering rail 208. Thus, the arms 201 and 202 are configured to freely move back and forth, freely move in the Y-axis direction, freely rise and lower, and freely rotate about the vertical axis, to be able to deliver the wafer W to/from the units of the shelf units U1 to U6, the first and second transfer stages TRS1 to TRS10, and the solution treatment units.

In this coating unit 95, the wafer W is carried into a processing chamber 99 via a carry-in/out port 98 by the main arm A4 and delivered to the spin chuck 3 of one of the coating sections 20, 21, and 22, which has been determined in advance. Then, the following treatment is performed, that is, the resist solution is supplied onto the central portion of the wafer W from the discharge port formed in the treatment solution nozzle 12a, and the spin chuck 3 is then rotated to spread and spread resist solution in the radial direction of the wafer W by centrifugal force to form a solution film of the resist on the surface of the wafer W. The wafer W for which a predetermined treatment has been finished in each of the coating sections 20, 21, and 22 is carried out to the outside of the coating unit 95 via the carry-in/out port 98 by the main arm A4.

The flow of the wafer W in the resist pattern forming apparatus will be described now, taking as an example a case in which anti-reflection films are formed on the upper and lower sides of the resist film. First, the carrier 90 is carried into the carrier block S1 from the outside, and a wafer W is taken out of the carrier 90 by the transfer arm C. The wafer W is delivered from the transfer arm C first to the first transfer stage TRS2 of the shelf unit U5 in the second unit block B2, and then to the main arm A5 of the BCT layer B5 via the first transfer stage TRS5 by the first delivery arm D1 in order that the wafer W is delivered to the BCT layer B5. Then, in the BCT layer B5, the wafer W is carried in the order of the cooling unit (COL), the first anti-reflection film forming unit, the heating unit (CHP), and the second transfer stage TRS10 of the shelf unit U6 by the main arm A5, resulting in the first anti-reflection film formed on the wafer W.

Subsequently, the wafer W on the second transfer stage TRS10 is carried to the second transfer stage TRS9 by the second delivery arm D2 in order that the wafer W is delivered to the COT layer B4, and then delivered to the main arm A4 of the COT layer B4. In the COT layer B4, the wafer W is carried in the order of the cooling unit (COL), the coating unit, the heating unit (CHP), and the first transfer stage TRS4 by the main arm A4, resulting in the resist film formed on the first anti-reflection film.

Subsequently, the wafer W on the transfer stage TRS4 is carried to the first transfer stage TRS3 by the first delivery arm D1 so that the wafer W is delivered to the TCT layer B3, and then delivered to the main arm A3 of the TCT layer B3. In the TCT layer B3, the wafer W is carried in the order of the cooling unit (COL), the second anti-reflection film forming unit, the heating unit (CHP), the edge exposure apparatus (WEE), and the second transfer stage TRS8 of the shelf unit U6 by the main arm A3, resulting in the second anti-reflection film formed on the resist film.

Subsequently, the wafer W on the second transfer stage TRS8 is carried by the interface arm B to the aligner S4, where the wafer W is subjected to the predetermined exposure processing. The wafer W after the exposure processing is carried to the second transfer stage TRS6 (TRS7) of the shelf unit U6 so that the wafer W is delivered to the DEV layer B1 (DEV layer B2), and the wafer W on the stage TRS6 (TRS7) is received by the main arm A1 (main arm A2) of the DEV layer B1 (DEV layer B2) and carried in the order of the heating unit (PEB), the cooling unit (COL), the developing unit, and the heating unit (POST) in the DEV layer B1 (B2), whereby the wafer W is subjected to predetermined developing treatment. The wafer W subjected to the developing treatment is carried to the first transfer stage TRS1 (TRS2) so that the wafer W is delivered to the transfer arm C, and then returned by the transfer arm C to the original carrier 90 mounted on the carrier block S1.

As described above, the solution treatment apparatus 10 of the present invention is applied as the coating unit and the anti-reflection film forming unit provided in the resist pattern forming apparatus being a coating and developing apparatus, whereby the exhausts in the cup bodies can be intended exhausts at all times in the plurality of coating sections provided in the coating unit and in the plurality of anti-reflection film forming sections provided in the anti-reflection film forming unit, as has been described. This allows for individual carriage among the blocks B1 to B4 by the main arms A1 to A5 and the first and second delivery arms D1 and D2 via the shelf units U5 and U6 in this apparatus, resulting in further improved throughput and improved yields of the wafers W because there is no possibility of adhesion of mist to the wafer W and unstable thickness of films on the wafer.

In addition, since the common exhaust pipe is installed in the coating unit and the anti-reflection film forming unit, these units are made compact as has been described. Accordingly, the various kinds of processing units can be closely provided in the processing block S2, resulting in reduced footprint of the coating and developing apparatus. Furthermore, each cup body is exhausted at a predetermined exhaust rate as has been described, thereby eliminating excessive exhaust, so that the exhaust volume of the whole unit can be reduced to reduce the exhaust volume of the plant facility.

What is claimed is:

1. A solution treatment apparatus in which a substrate holding portion is rotated with a treatment solution being supplied from a treatment solution nozzle onto a substrate held on the substrate holding portion to spread the treatment solution on the substrate, said apparatus comprising:
   a plurality of solution treatment sections, each of said solution treatment sections including:
      a rotatable substrate holding portion;
      a cup body provided to surround a substrate held on said substrate holding portion;
      an exhaust path connected to said cup body and
      an exhaust rate adjustment section provided in said exhaust path;
   a common exhaust path, said exhaust path of each of said solution treatment sections connecting said cup body thereof to said common exhaust path;
   a storage section for storing data in which combinations of exhaust rates of said exhaust path of each solution treatment section is set in such order that the exhaust rate of each cup body may have a predetermined exhaust rate; and
   a control section for determining the number of rotations of said substrate holding portion of each treatment section, for reading a combination of set exhaust rates corresponding to a combination of the determined number of rotations of each said substrate holding portion by referring to the data in said storage section, and for adjusting an opening of each said exhaust rate adjustment section to obtain openings corresponding to the read set exhaust rates.

2. The solution treatment apparatus as set forth in claim 1, wherein the determination of the number of rotations of said substrate holding portion of each treatment section is performed by detecting the number of rotations of said substrate holding portion of each treatment section.

3. The solution treatment apparatus as set forth in claim 1, wherein said exhaust rate adjustment section of each treatment section is a damper.

4. The solution treatment apparatus as set forth in claim 1, wherein said cup bodies are horizontally arranged in a line in a common casing, and the treatment solution nozzle is in common use for each substrate held on said substrate holding portion of each treatment section.

5. The solution treatment apparatus as set forth in claim 1, further comprising:
   a cleaning solution nozzle for supplying a cleaning solution onto the substrate.

6. The solution treatment apparatus as set forth in claim 1, further comprising:
   a cleaning solution nozzle for supplying a cleaning solution onto the substrate, said cleaning solution nozzle being in common use for each substrate held on said substrate holding portion of each treatment section.

7. The solution treatment apparatus as set forth in claim 1, wherein a length of said exhaust path from a joint position where said exhaust path of each treatment section is joined together to a closest cup body is within 150 mm.

8. The solution treatment apparatus as set forth in claim 4, wherein a joint point where exhaust path of each treatment section is joined together is located in the common casing.

9. A solution treatment apparatus in which a substrate holding portion is rotated with a treatment solution being supplied from a treatment solution nozzle onto a substrate held on the substrate holding portion to spread the treatment solution on the substrate, said apparatus comprising:
   a plurality of solution treatment sections, each of said solution treatment sections including:
      a rotatable substrate holding portion;
      a cup body provided to surround a substrate held on said substrate holding portion;
      an exhaust path connected to said cup body;
      an exhaust rate adjustment section provided in said exhaust path; and
      an exhaust rate amplification mechanism provided in said exhaust path; and
   a common exhaust path, said exhaust path of each of said solution treatment sections connecting said cup body thereof to said common exhaust path,
   wherein said substrate holding portion of each treatment section is set to have a number of rotations corresponding to a state of solution treatment on the substrate,
   wherein said exhaust rate adjustment section of each treatment section is setable to have an opening corresponding to a high-rate of exhaust, a medium-rate of exhaust, and a low-rate of exhaust, such that said exhaust rate of said cup body of each treatment section has a predetermined exhaust rate corresponding to said number of rotations of said substrate holding portion of each treatment section, and
   wherein, if said predetermined exhaust rate cannot be attained for said cup body of each treatment section, said exhaust rate amplification mechanism of each treatment section operates to supplement said shortage of exhaust rate such that the exhaust rate in said cup body has said predetermined exhaust rate.

10. The solution treatment apparatus as set forth in claim 9, wherein said exhaust rate adjustment section of each treatment section is a damper.

11. The solution treatment apparatus as set forth in claim 9, wherein said cup bodies are horizontally arranged in a line in a common casing, and the treatment solution nozzle is in common use for each substrate held on said substrate holding portion of each treatment section.

12. The solution treatment apparatus as set forth in claim 9, further comprising:
   a cleaning solution nozzle for supplying a cleaning solution onto the substrate.

13. The solution treatment apparatus as set forth in claim 11, further comprising:
   a cleaning solution nozzle for supplying a cleaning solution onto the substrate, said cleaning solution nozzle being in common use for each substrate held on said substrate holding portion of each treatment section.

14. The solution treatment apparatus as set forth in claim 9, wherein a length of said exhaust path from a joint position where said exhaust path of each treatment section is joined together to a closest cup body is within 150 mm.

15. The solution treatment apparatus as set forth in claim 11, wherein a joint point where said exhaust path of each treatment section is joined together is located in the common casing.

\* \* \* \* \*